United States Patent [19]
Mizuno et al.

[11] Patent Number: 6,084,310
[45] Date of Patent: Jul. 4, 2000

[54] SEMICONDUCTOR DEVICE, LEAD FRAME, AND LEAD BONDING

[75] Inventors: Hideki Mizuno; Mitsunori Kanemoto, both of Tokyo, Japan

[73] Assignee: NEC Corporation, Tokyo, Japan

[21] Appl. No.: 09/063,055

[22] Filed: Apr. 21, 1998

[30] Foreign Application Priority Data

Apr. 21, 1997 [JP] Japan .................................... 9-103192

[51] Int. Cl.[7] .................................................. H01L 23/48
[52] U.S. Cl. .......................... 257/779; 257/692; 257/696; 257/735
[58] Field of Search ................................. 257/696, 692, 257/735, 779

[56] References Cited

U.S. PATENT DOCUMENTS

| | | | |
|---|---|---|---|
| 5,863,805 | 1/1999 | Chiang ........................................ | 437/20 |
| 5,886,405 | 3/1999 | Kim et al. ................................. | 257/692 |
| 5,917,241 | 6/1999 | Nakayama et al. ....................... | 257/728 |

FOREIGN PATENT DOCUMENTS

| | | |
|---|---|---|
| 1-128893 | 5/1989 | Japan . |
| 5-129473 | 5/1993 | Japan . |
| 6-349890 | 12/1994 | Japan . |
| 7-201928 | 8/1995 | Japan . |
| 10-93000 | 4/1998 | Japan . |

*Primary Examiner*—Leo P. Picard
*Assistant Examiner*—Hung Van Duong
*Attorney, Agent, or Firm*—Sughrue, Mion, Zinn, Macpeak & Seas, PLLC

[57] ABSTRACT

In a semiconductor device, each of a plurality of leads has a chip mounting portion electrically connected to the semiconductor chip through a bump and a lead main body supporting the chip mounting portion. A lead path from the distal end of the lead main body to the bump is bent in X, Y, and Z directions so that the distal end portion of the lead main body and the chip mounting portion are arranged on different levels when viewed from a side surface. The lead main body and the chip mounting portion substantially make a right angle to form an L shape when viewed from an upper side. The semiconductor chip is connected, through bumps, to upper surfaces of distal end portions of the chip mounting portions of the leads on a plane. A molded body seals constituent elements except a part separated from a connection portion between the lead main body and the chip mounting portion, and incorporates a bent portion of the lead main body. Each lead is arranged such that the chip mounting portions are arranged on both sides of a centerline of the semiconductor device in a longitudinal direction to be parallel to the centerline. The L-shaped leads are arranged on one side such that the chip mounting portions oppose each other on a plane. A lead frame and lead bonding are also disclosed.

39 Claims, 7 Drawing Sheets

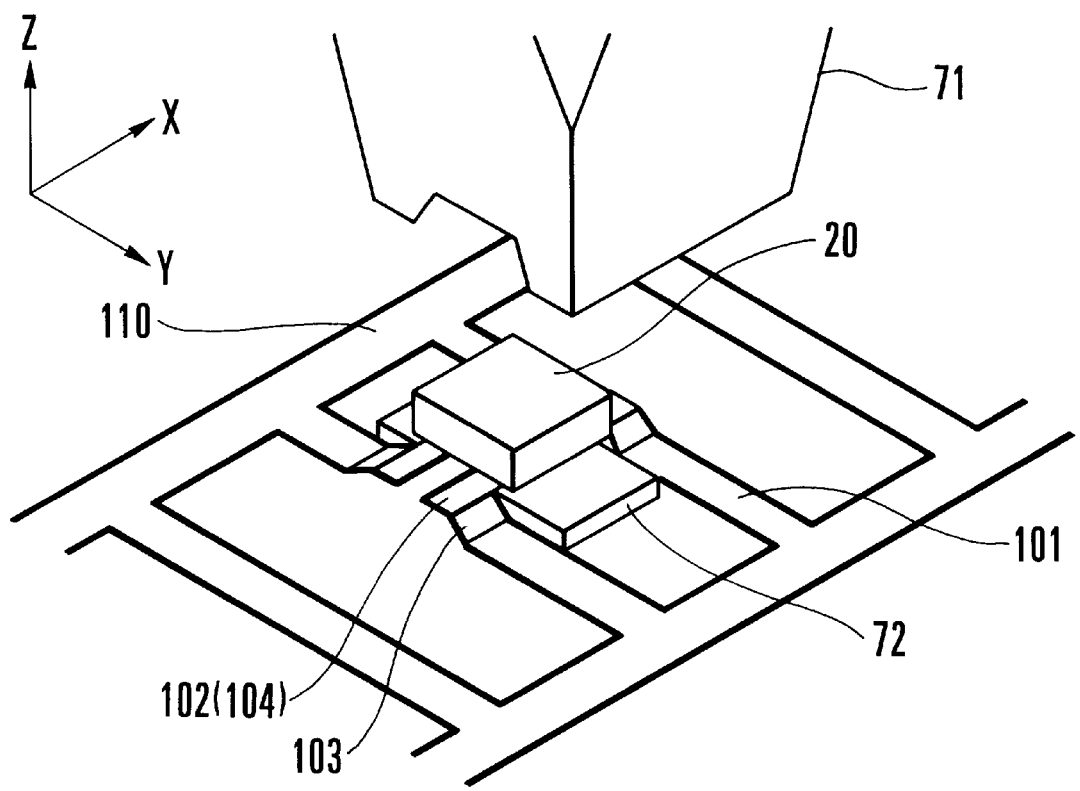
F I G. 6

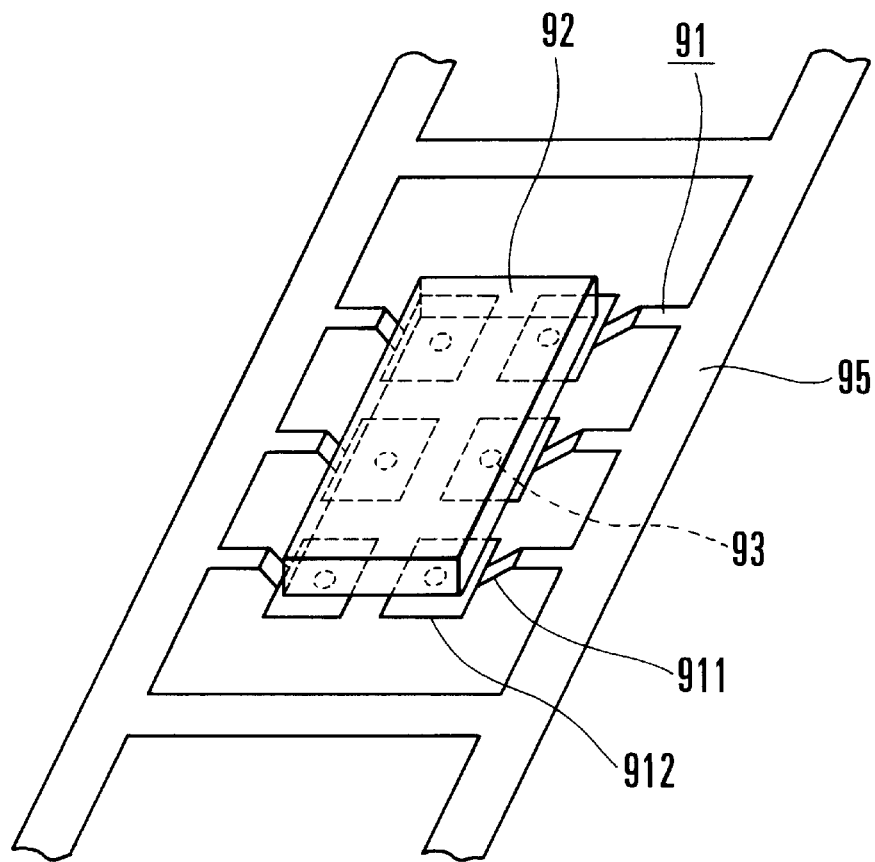
F I G. 7 A
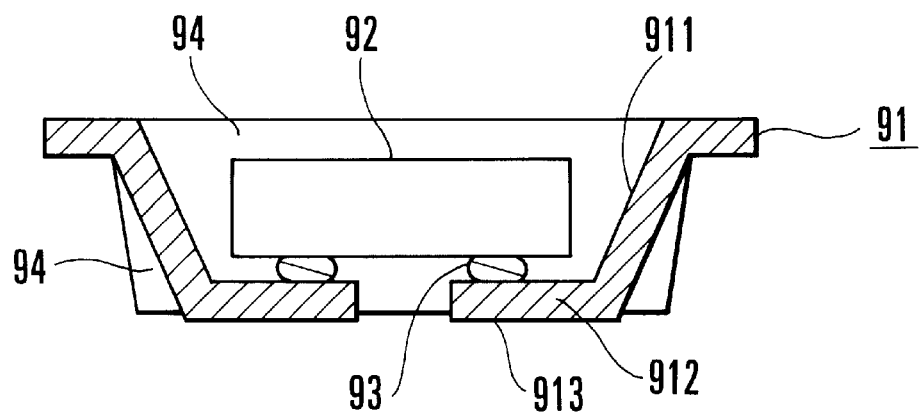
F I G. 7 B

SEMICONDUCTOR DEVICE, LEAD FRAME, AND LEAD BONDING

BACKGROUND OF THE INVENTION

The present invention relates to a semiconductor device and, more particularly, to a compact and low-profile sealed semiconductor device formed by bonding a semiconductor chip to a lead frame through bumps.

Electronic apparatuses are required to be compact and lightweight, and a semiconductor device to be mounted in an electronic apparatus is also required to be compact and low-profile.

For a conventional semiconductor device, a semiconductor chip is bonded to leads by wire bonding. This technique is not suitable for a low-profile semiconductor device because wires are looped and must be covered with a resin. In addition, since the wires have an inductance component, a high-frequency semiconductor chip becomes poor in high-frequency characteristics.

To solve these problems, a technique of connecting a semiconductor chip to leads through bumps is known. In, e.g., Japanese Patent Laid-Open No. 7-201928 (to be referred to as "prior art 1" hereinafter), a semiconductor chip is mounted on a TAB tape and sealed with a resin. Generally, a conductive pattern having a film-like tape shape is used as leads for a TAB tape, and these leads are as thin as 20 to 50 μm. Because of the thin leads, a film carrier (3b in FIG. 1 of prior art 1) is required to keep a high mechanical strength, resulting in an increase in manufacturing cost.

To mount the semiconductor chip on a printed circuit board and solder them, the leads must be extracted from the resin-sealed portion. However, since one surface of each lead is covered with the film, the soldering properties degrade. If the film is removed to improve the soldering properties, outer leads are readily bent, so the solder is not connected to the printed circuit board or short-circuited to other printed patterns. As described above, the semiconductor device formed using the TAB tape is inconvenient to use for surface mounting.

Another semiconductor IC device is disclosed in Japanese Patent Laid-Open No. 1-128893 (to be referred to as "prior art 2" hereinafter). FIG. 7A shows a chip mounted on a lead frame 91 through bumps 93. This prior art has as its object to obtain a low-profile semiconductor IC device. FIG. 7B shows the section of the device.

In this semiconductor IC device, an IC chip 92 matches facedown each chip mounting piece 912 formed at one end of each of the plurality of leads 91 and is directly connected to the leads 91 through the bumps 93. The IC chip 92 is sealed with a molded body 94 together with the leads 91 each having a bent portion 911.

When the IC chip 92 and the leads 91 having the bent portions 911 are to be sealed, a lower surface 913 of the chip mounting piece 912 is exposed from the lower surface of the molded body 94. This lower surface 913 (exposed surface) of the chip mounting piece 912 functions as an external connection terminal. The exposed surface 913 also functions as a heat dissipation surface for removing heat from the IC chip 92.

FIG. 1B of Japanese Patent Laid-Open No. 5-129473 (to be referred to as "prior art 3" hereinafter) shows a chip-size package. In prior art 3, a semiconductor chip is mounted on rectilinear inner leads through bumps and sealed with a sealing member.

However, the conventional semiconductor devices have the following problems.

The first problem is connection between the semiconductor chip and the lead frame in the manufacturing process. As shown in FIG. 2 of prior art 2, when an IC chip 1 is mounted on a lead frame 2 before resin sealing, the IC chip 1 and the lead frame 2 are connected only through bumps. If external mechanical vibration, impact, or thermal stress is applied in the manufacturing process, disconnection occurs to result in an electrical connection failure. More specifically, the stress applied to the bumps includes vibration generated upon conveying the lead frame, an impact generated upon placing the lead frame on a working table or picking up it, a stress due to thermal expansion of the lead frame in thermal bump bonding or contraction in cooing the lead frame, and a stress due to deformation in moving the lead frame. Especially, in prior art 2, when an impact is applied from the short-side direction of the lead frame, a strong impact is readily transmitted to the bumps because of the short distance between leads 3 and the bumps.

In the semiconductor IC of prior art 2, the lower surface (exposed surface 913) of the chip mounting piece 912 connected to the IC chip 92 through the bump 93 is exposed from the molded body 94 as an external connection terminal, as shown in FIG. 7B. For this reason, connection to the IC chip 92 may become loose or peeling may occur due to a mechanical impact to result in an electrical contact failure.

As the second problem, in the semiconductor IC device of prior art 2, the lower surface 913 of the chip mounting piece 912 on which the IC chip 92 is mounted is exposed from the lower surface of the molded body 94 as an external connection terminal. For this reason, the leakage path for external moisture has a very short length corresponding to the thickness of the chip mounting piece 912, resulting in poor humidity resistance.

In addition, in the semiconductor IC device of prior art 2, the molded body 94 incorporates the bent portions 911 formed at the leads 91 to prevent removal of the chip mounting piece 912. Since the IC chip 92 is mounted on the recessed side of the leads 91 when viewed from the side surface, the bent portions 911 must be formed in consideration of the two-dimensional size of the IC chip 92 and the mounting position accuracy with respect to the two-dimensional size. Therefore, the two-dimensional size of the molded body 94 becomes larger than the interval between the chip mounting pieces 912 functioning as external connection terminals because the two-dimensional size of the molded body 94 cannot be made close to the size of the IC chip 92, resulting in an increase in mounting area of the printed circuit board.

As the third problem, in the resin-sealed surface-mounted semiconductor device of prior art 3, rectilinear outer leads with their upper and side surfaces being covered with a resin are used, so the leads are sometimes removed from the sealing member. In addition, the lead interval is determined by the electrode interval of the semiconductor chip. For this reason, for a small signal transistor having a semiconductor chip with a size of 0.5 mm□, the interval between leads is as small as about 0.1 mm. If such a package is mounted on a printed circuit board, a solder bridge is readily generated. Inversely, to increase the lead interval, the size of the semiconductor chip must increase, resulting in an increase in cost.

SUMMARY OF THE INVENTION

The present invention has been made in consideration of the above problems, and has as its object to keep a high bump connection strength in the manufacturing process.

It is another object of the present invention to ensure humidity resistance in a compact and low-profile sealed semiconductor device.

It is still another object of the present invention to reduce the occupied area upon mounting a component by making the two-dimensional size of a sealing member close to the size of a semiconductor chip while preventing removal of leads.

In order to achieve the above object, according to an aspect of the present invention, there is provided a semiconductor device comprising a plurality of leads each having a chip mounting portion electrically connected to a semiconductor chip through a bump and a lead main body supporting the chip mounting portion, in which a lead path from a distal end of the lead main body to the bump is bent in X, Y, and Z directions so that the distal end portion of the lead main body and the chip mounting portion are arranged on different levels when viewed from a side surface, and the lead main body and the chip mounting portion substantially make a right angle to form an L shape when viewed from an upper side, a semiconductor chip connected, through bumps, to upper surfaces of distal end portions of the chip mounting portions of the leads which are arranged on a plane, and a molded body sealing constituent elements except a part separated from a connection portion between the lead main body and the chip mounting portion, and incorporating a bent portion of the lead main body, wherein each of the plurality of leads is arranged such that the chip mounting portions are arranged on both sides of a centerline of the semiconductor device in a longitudinal direction to be parallel to the centerline, and the L-shaped leads are arranged on one side such that the chip mounting portions oppose each other on a plane.

According to another aspect of the present invention, there is provided a lead frame comprising two outer frames parallel to each other, and a plurality of leads each having a chip mounting portion electrically connected to a semiconductor chip through a bump and a lead main body extending between the parallel outer frames on the same plane as that of the outer frames to support the chip mounting portion, in which a lead path from a distal end of the lead main body to the bump is bent in X, Y, and Z directions so that the distal end portion of the lead main body and the chip mounting portion are arranged on different levels when viewed from a side surface.

According to still another aspect of the present invention, there is provided lead bonding comprising the steps of forming a lead frame in which a plurality of leads each having a chip mounting portion electrically connected to a semiconductor chip through a bump and a lead main body supporting the chip mounting extend between two outer frames parallel to each other on the same plane as that of the outer frames, the lead main body and the chip mounting portion substantially making a right angle to form an L shape when viewed from an upper side, and the chip mounting portions connected to the lead main bodies being arranged to oppose each other on a plane, forming a bent portion having a step shape projecting upward when viewed from a side surface at a portion of the lead main body of each L-shaped lead, which is close to the chip mounting portion, heating the chip mounting portion arranged on a level different from that of the lead main body by the bent portion to bond the semiconductor chip on which bumps have been formed in advance on an upper surface of a distal end portion of the chip mounting portion while matching the semiconductor chip with the upper surface of the chip mounting portion, sealing the chip mounting portion of the L-shaped lead and a portion of the lead main body up to the bent portion together with the semiconductor chip to form a molded portion, and cutting off the leads near the molded portion.

BRIEF DESCRIPTION OF THE DRAWINGS

FIG. 6 is a view for explaining a process of connecting bumps in the method of manufacturing the semiconductor device according to the third embodiment;

FIG. 7A is a view showing the lead frame of a conventional semiconductor IC device; and FIG. 7B is a sectional view of the conventional semiconductor IC device.

DESCRIPTION OF THE PREFERRED EMBODIMENTS

Embodiments of the present invention will be described below with reference to the accompanying drawings.

Figure 1A:
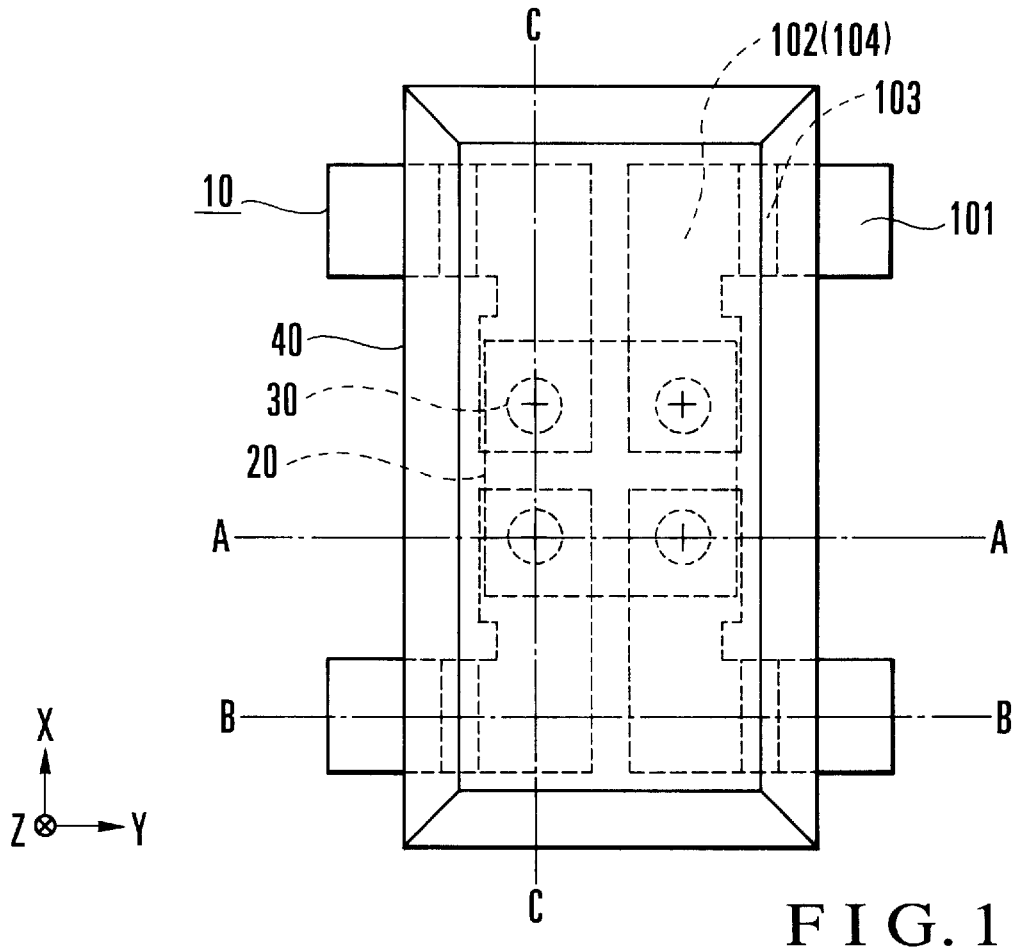
FIG. 1A is a plan view showing the structure of a semiconductor device according to the first embodiment of the present invention.
Figure 1B:
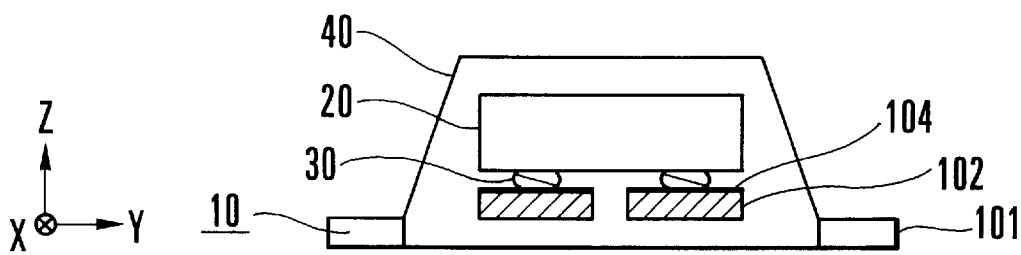
FIGS. 1B and 1C are sectional views showing the structure of the semiconductor device according to the first embodiment of the present invention.
Figure 1C:
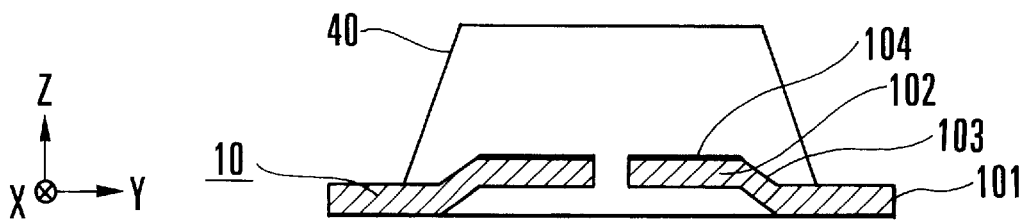
Figure 2A:
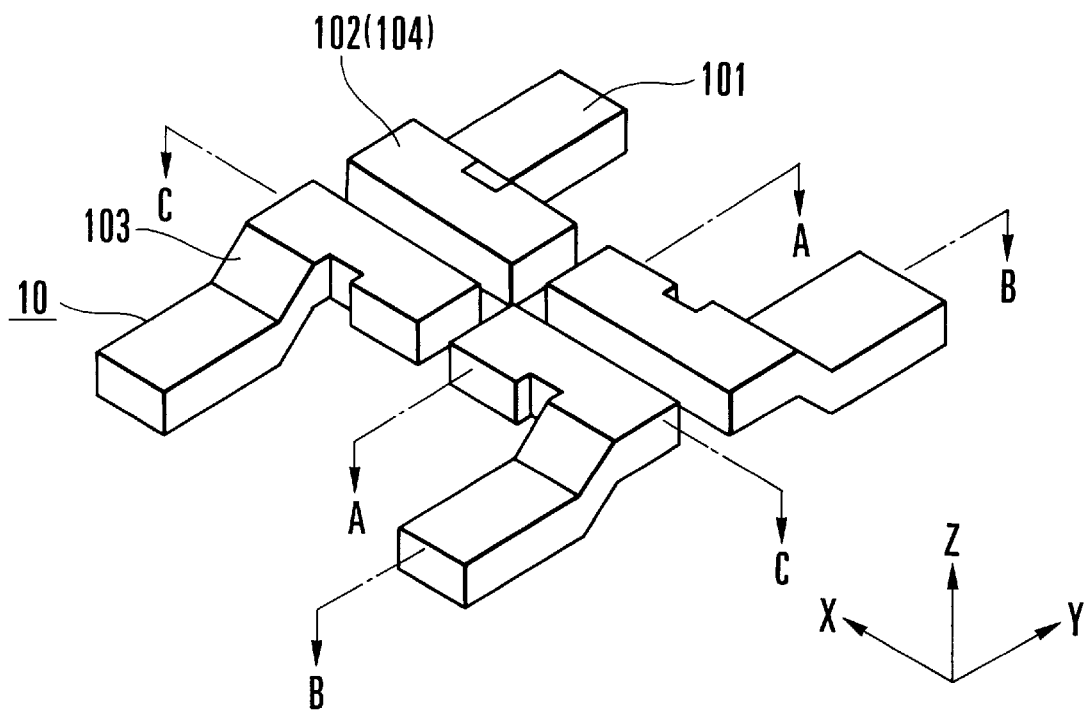
FIGS. 2A and 2B are perspective views of the semiconductor device according to the first embodiment of the present invention.
Figure 2B:
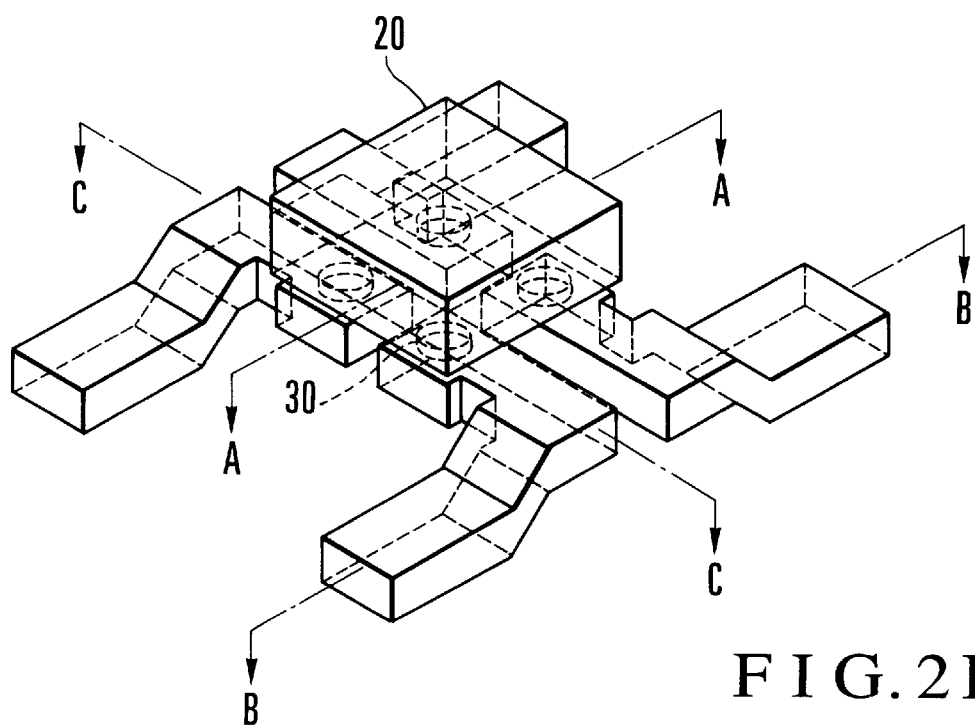

FIGS. 1A to 1C show the structure of a semiconductor device according to the first embodiment of the present invention. FIGS. 2A and 2B show the relationship between leads and a semiconductor chip.

As shown in FIG. 1A, in the semiconductor device of this embodiment, two L-shaped leads 10 each having a lead main body 101 and a chip mounting piece 102, which make an almost right angle when viewed from the upper side, are arranged on each side of the centerline of the semiconductor device along the longitudinal direction. The L-shaped leads 10 are arranged on one side such that sides of the chip mounting pieces 102 oppose each other.

FIGS. 1B and 1C show sections taken along lines A—A and B—B in FIG. 1A, respectively.

As shown in FIGS. 1B and 1C, the lead main body 101 has a bent portion 103 so that the lead main body 101 serving as an external connection terminal and the chip mounting piece 102 of each L-shaped lead 10 are on different levels. Therefore, the lead main bodies 101 and the chip mounting pieces 102 have a shape projecting upward when viewed from the side surface.

The bottom surfaces of the lead main bodies 101 of the four L-shaped leads 10, which serve as external connection terminals, are arranged on a plane. The upper surfaces of the chip mounting pieces 102 which are formed on a level different from that of the lead main bodies 101 by the bent portions 103 are also arranged on a plane.

Each surface electrode (not shown in FIGS. 1A to 1C) of a semiconductor chip 20 matches the upper surface of the distal end portion of the chip mounting piece 102 of each L-shaped lead 10 having the above structure and is directly connected to the chip mounting piece 102 through a metal bump 30. As a result, the semiconductor chip 20 is mounted facedown on the chip mounting pieces 102 of the L-shaped leads 10.

The bumps 30 are formed from a Pb-5% Sn or Pd-1% Au alloy which is less likely to be fatigued by thermal distortion. Au may be used instead of Pb—Sn.

For satisfactory bonding using the bumps 30, the upper surfaces of the chip mounting pieces 102 are subjected to surface treatment using a gold, silver, or platinum film 104.

The semiconductor chip 20, and the chip mounting pieces 102 and the bent portions 103 of the L-shaped leads 10 are sealed in a resin-molded portion 40.

The lead main bodies 101 exposed from the resin-molded portion 40 and serving as external connection terminals are solder- or Au-plated, although it is not illustrated.

The bottom surface of the resin-molded portion 40 is flush with the lower surfaces of the lead main bodies 101 serving as external connection terminals, thus allowing stable component mounting.

A resin is preferably used as the sealing body, i.e., the molded body from the viewpoint of easy manufacturing and low manufacturing cost.

In the semiconductor device having the above structure, the leakage path from the outer environment of the semiconductor device to the semiconductor chip 20 corresponds to at least the length of the bent portion 103 and the chip mounting piece 102 of the L-shaped lead 10. By ensuring a longer leakage path than that of the conventional semiconductor device, the humidity resistance can be improved.

The chip mounting pieces 102 are completely incorporated in the resin-molded portion 40, and a portion of each L-shaped lead 10 from the bent portion 103 to the chip mounting piece 102 is sealed by the resin-molded portion 40. For this reason, disconnection at the bump 30 or removal of the L-shaped leads 10 can be prevented.

In addition, the lead main body 101 and the chip mounting piece 102 are formed on different levels such that they have a shape projecting upward when viewed from the side surface, and the semiconductor chip 20 is mounted on the upper surfaces of the chip mounting pieces 102. When the bent portions 103 of the L-shaped leads 10 are to be formed, the chip mounting accuracy with respect to the distance between the bumps 30, i.e., the surface electrode interval of the semiconductor chip 20 is taken into consideration. Therefore, the two-dimensional size and, more particularly, the width of the resin-molded portion 40 can be made close to the size of the semiconductor chip 20, so a compact semiconductor device can be obtained.

Furthermore, since the width of the resin-molded portion 40 can be made smaller than the distances between the external connection terminals (exposed lead main bodies 101), the mounting area of the printed circuit board upon mounting a component can be reduced.

In addition, as shown in FIG. 1A, the L-shaped leads 10 are arranged on one side of the semiconductor device such that the chip mounting pieces 102 oppose each other. With this arrangement, the lead main bodies 101 as external connection terminals can be arranged at an arbitrary interval larger than the surface electrode distance of the semiconductor chip 20. Therefore, a solder bridge is less likely to be generated between the leads 10 upon mounting a component.

The second embodiment of the present invention will be described next with reference to FIGS. 3A to 3C.

Figure 3A:
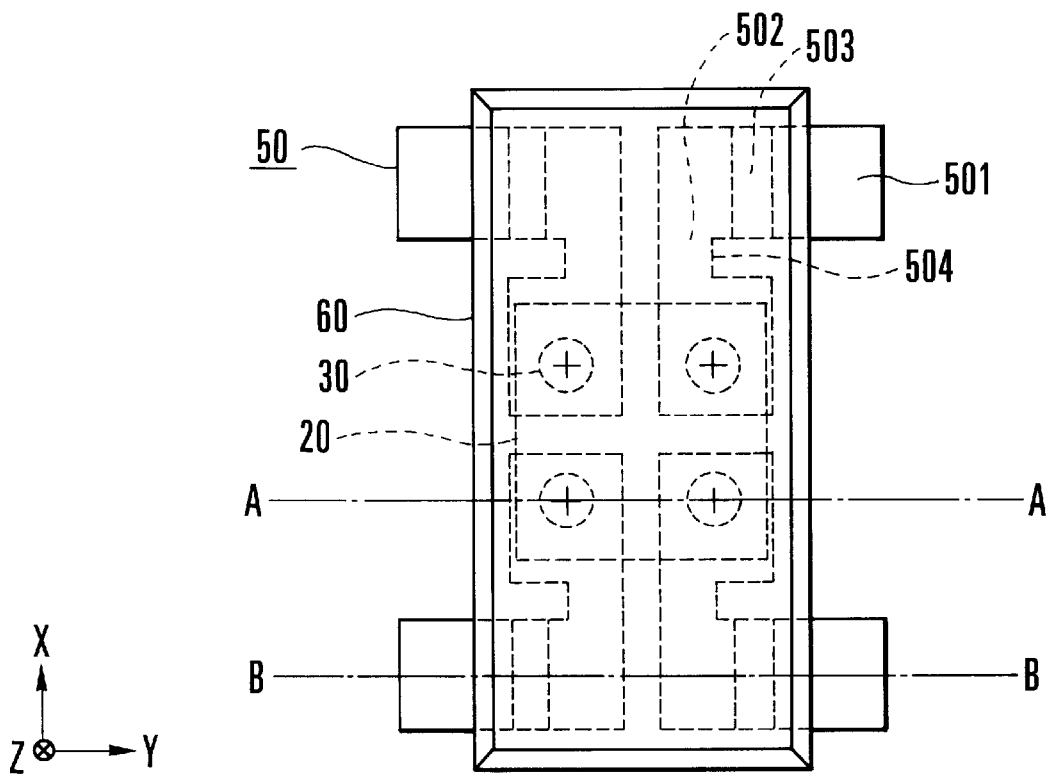
FIG. 3A is a plan view showing the structure of a semiconductor device according to the second embodiment of the present invention.
Figure 3B:
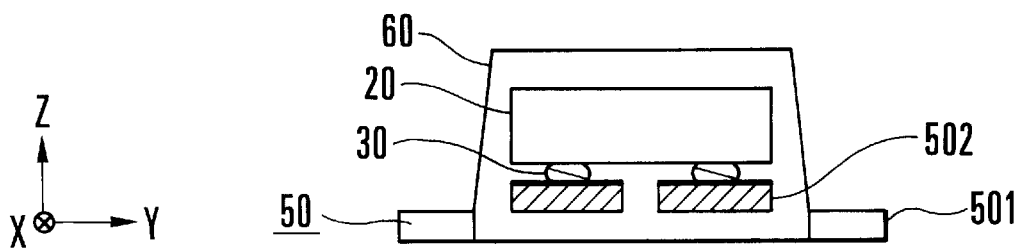
FIGS. 3B and 3C are sectional views showing the structure of the semiconductor device according to the second embodiment of the present invention.
Figure 3C:
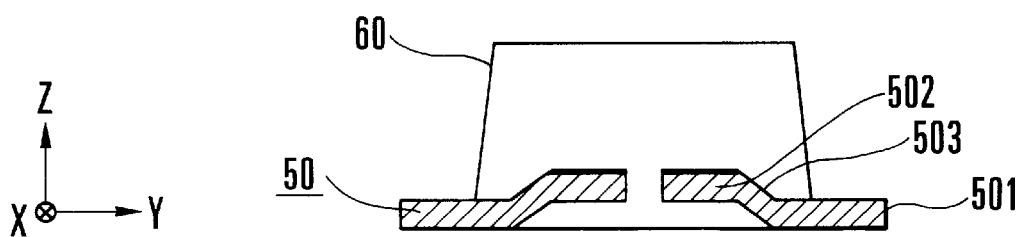

FIGS. 3A to 3C show the structure of a semiconductor device according to the second embodiment.

The basic structure of the semiconductor device of this embodiment is the same as that of the first embodiment, and a detailed description thereof will be omitted.

According to the characteristic feature of the semiconductor device of this embodiment, a chip mounting portion 502 of each L-shaped lead 50 has a notch 504 at the connection portion between the chip mounting portion 502 and a lead main body 501 along the lead main body 501, and the lead main body 501 is bent from this notch 504 to form a bent portion 503.

Even when the notch 504 and the bent portion 503 are formed, the interval between the lead main bodies 501 of the L-shaped leads 50 arranged on one side of the semiconductor device is larger than the distance between bumps 30 of a semiconductor chip 20, so connection between the chip mounting portion 502 and the semiconductor chip 20 is not affected.

In the semiconductor device of this embodiment, the chip mounting portion 502 of the lead main body 501 can be formed closer to the center of the semiconductor device, i.e., closer to the centerline along the longitudinal direction than in the first embodiment. For this reason, the two-dimensional size and, more particularly, the width of a resin-molded portion 60 can be further made closer to the size of the semiconductor chip 20. In other words, the size of the semiconductor device can be reduced.

As the third embodiment of the present invention, a method of manufacturing the semiconductor device of the first embodiment and lead bonding will be described next with reference to FIGS. 4 and 5A*a* to 5D*b*.

Figure 4:
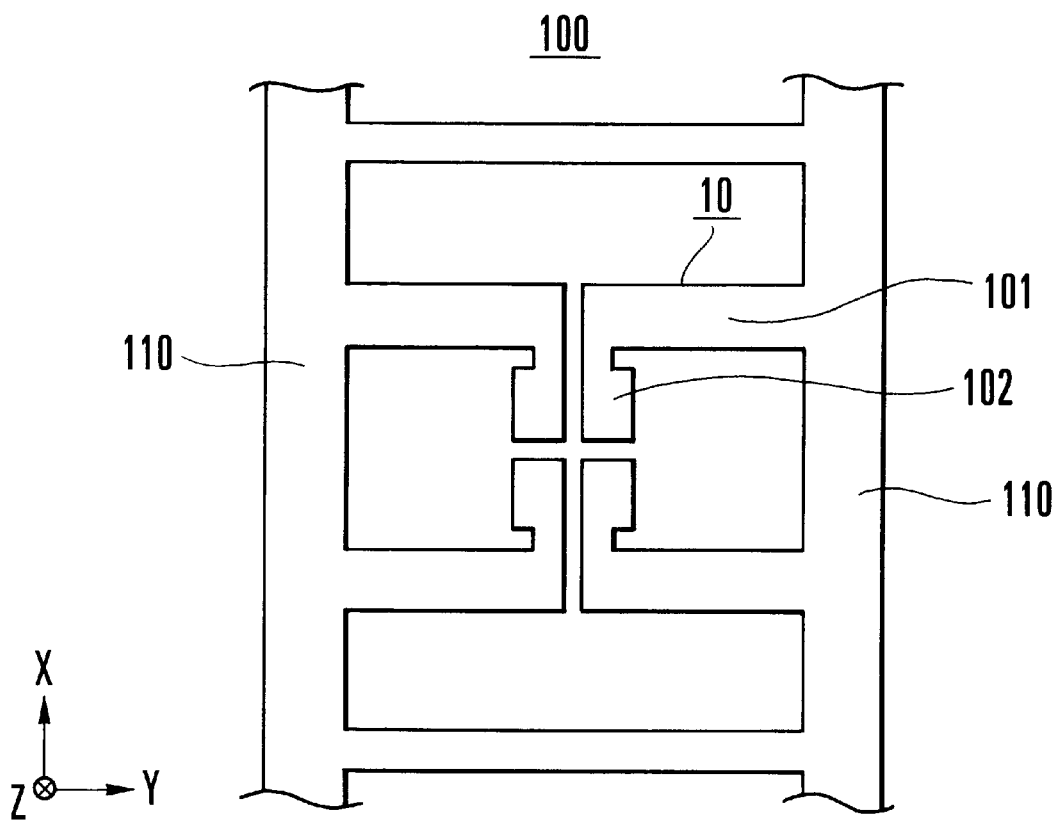
FIG. 4 is a view showing a lead frame used for the semiconductor device according to the first embodiment of the present invention.

FIG. 4 explains a lead frame. FIGS. 5A*a* to 5D*b* explain the steps in the manufacture of the semiconductor device shown in FIGS. 1A to 1C. FIGS. 5A*a* to 5D*a* and FIGS. 5A*b* to 5D*b* explain the steps in the manufacture in correspondence with the sections of the semiconductor device shown in FIGS. 2A and 2B, which are taken along the lines A—A and C—C in FIG. 1, respectively.

In lead bonding of this embodiment, a lead frame 100 having a predetermined shape is formed.

As shown in FIG. 4, the lead frame 100 has a plurality of L-shaped leads 10 between two outer frames 110 parallel to each other. Each L-shaped lead 10 has a lead main body 101 and a chip mounting portion 102. Each chip mounting portion 102 is substantially formed at a right angle with respect to the lead main body 101. Two L-shaped leads 10 are formed on each outer frame 110 such that the sides of the chip mounting pieces 102 oppose each other at an interval of 0.1 mm.

In this embodiment, the lead frame 100 can be obtained by etching or pressing a copper plate having a thickness of 0.1 to 0.2 mm.

For the lead frame 100, a conductor such as a metal, e.g., copper or an alloy thereof, or iron or an alloy thereof can be used. To form the lead frame 100 into a predetermined planar shape, a conductive plate can be pressed or fabricated using etching or a laser beam.

To obtain good bonding properties, the lead frame may be subjected to surface treatment using a noble metal such as gold, platinum, or silver in advance.

A description will be made below while setting the X-axis along the longitudinal direction of the lead frame outer frame 110, the Y-axis along the short-side direction, and the Z-axis along the vertical direction.

Figure 5A:
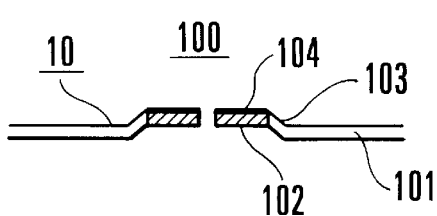
FIGS. 5A*a* to 5D*a* and FIGS. 5A*b* to 5D*b* are views for explaining a method of manufacturing a semiconductor device according to the third embodiment of the present invention.
Figure 5A:
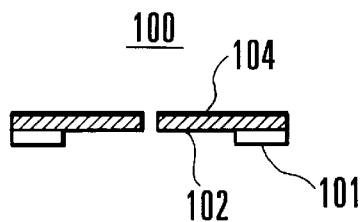

A silver plating film 104 having a thickness of about 5 to 8 μm is formed on the upper surface of each chip) mounting portion 102 of the lead frame 100, and then, a bent portion 103 is formed at a position close to the chip mounting portion 102 of each lead main body 101 (FIGS. 5A*a* and 5A*b*).

With the bent portion 103 having a step shape projecting upward when viewed from the side surface, the chip mounting portion 102 is arranged on a level different from that of the lead main body 101. Therefore, the bent portion 103 need not always be perpendicular to the remaining portion of the lead main body 101 or the chip mounting portion 102 and may be tilted. If the bent portion 103 is to be formed by pressing, a tilt angle of about 45° is appropriate because of limitations on fabrication, although it changes depending on the material of the lead.

In this embodiment, the L-shaped lead 10 constituted by the lead main body 101 and the chip mountings portion 102 has a thickness of 0.1 to 0.2 mm. The bent portion 103 is formed at an angle of about 45°.

Such a bent portion 103 is formed by positioning the lead frame 100 and pressing the distal end portion of the L-shaped lead 10.

As a result, each chip mounting portion 102 projects to the upper surface side of the lead frame 100 by the thickness of the lead frame 100. Sides of the chip mounting pieces 102 are arranged at an interval of about 0.1 mm.

Figure 5B:
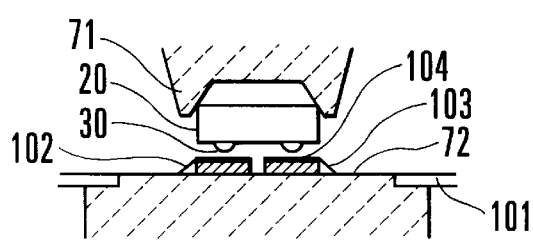
Figure 5B:
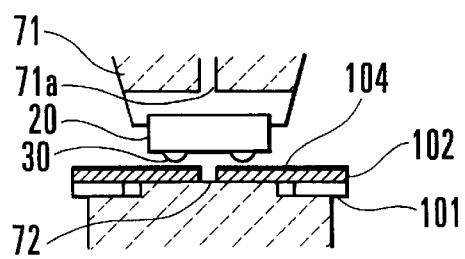

In this manner, the bent portion 103 is formed, and the chip mounting portion 102 is arranged on a level different from that of the lead frame 100. After this, a semiconductor chip 20 is directly connected to the distal end portion of each chip mounting portion 102 through a bump by thermosonic wire bonding or thermocompression bonding (FIGS. 5B*a*, 5B*b*, and 6).

The semiconductor chip 20 has a square planar shape having one side of 0.51 mm and a thickness of 0.2 mm. Surface electrodes (not shown) are formed at the four corners of the surface of the semiconductor chip.

An Au ball bump 30 having a diameter of 0.1 mm and a thickness of 0.04 mm is formed in advance on each surface electrode of the semiconductor chip 20 by ultrasonic bonding using an Au wire.

The bumps 30 may be formed by plating or depositing a solder bump of, e.g., Pb—Sn.

To connect the bump, the distal end portion of each chip mounting portion 102 supported by a supporting table 72 is heated at 350° C. to 370° C. Simultaneously, while applying an ultrasonic wave to a pyramidal collet 71 supporting facedown the semiconductor chip 20, the distal and portion of the chip mounting portion 102 is made to match the bump 30, pressed, and connected. Note that a suction port 71*a* is formed at the center of the collet 71 (FIG. 5B*b*).

For the chip mounting portions 102 on which the semiconductor chip 20 is to be mounted, the mounting position accuracy of the semiconductor chip 20 with respect to the distance between bumps 30 is taken into consideration. Therefore, the interval between the bent portions 103 of the lead main bodies 101 which are formed to project stepwise can be determined on the basis of not the two-dimensional size of the semiconductor chip 20 but the interval between the bumps 30 (FIG. 5B*a*).

In prior art 2 or 3, the chip mounting portion is supported using a flat supporting table. However, if the lead frame has a bent portion, the supporting table must partially have a convex shape. When the supporting table has a projecting portion, the projecting portion of the supporting table and the chip mounting portion can hardly be positioned, or the heating temperature lowers when the lead frame contacts the supporting table, resulting in a low bonding strength.

In this embodiment, however, each L-shaped lead 10 has an L shape, and the L-shaped leads 10 formed on one side of the lead frame 100 are arranged such that the chip mounting portions 102 oppose each other. For this reason, as shown in FIGS. 5B*a* and 6, the supporting table 72 wider than the chip mounting portion 102 in the short-side direction of the lead frame, i.e., in the Y-axis direction can be used by taking advantage of the gap between the lead main bodies 101.

As described above, when the supporting table 72 to be used for thermal bonding is wider than the chip mounting portion, a margin can be obtained in the short-side direction of the lead frame in mounting the chip mounting portion 102 on the supporting table 72. As a result, positioning in the bump connection process is facilitated.

In addition, since the thermal capacity of the supporting table 72 can be increased, the decrease in heating temperature in thermocompression bonding can be minimized.

Since the lead from the outer frame 110 of the lead frame 100 to the bump 30 is long, and the lead has an L shape, the vibration, impact, or thermal stress in the X- and Y-axis directions can be absorbed. By forming the bent portion 103, the vibration, impact, or thermal stress in the Y- and Z-axis directions can be absorbed. Therefore, the mechanical or thermal stress generated during the manufacturing process can be prevented from concentrating on the bump 30, so the connection strength of the bump 30 can be kept stable.

Furthermore, since the upper surface of each chip mounting portion 102 is subjected to surface treatment using gold, silver, or platinum plating 104, a sufficient bonding strength can be obtained between the semiconductor chip 20 and the chip mounting portion 102.

After the semiconductor chip 20 is connected to the lead frame 100 through the bumps 30, the semiconductor chip 20 and the chip mounting portions 102 of the L-shaped leads 10 are sealed with a thermosetting resin, thereby forming the molded portion 40.

A resin is preferably used for the sealing body serving as the molded body to facilitate manufacturing and reduce the manufacturing cost.

Figure 5C:
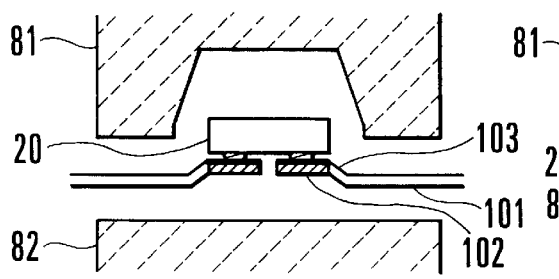
Figure 5C:
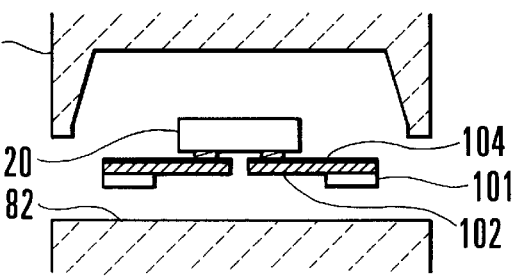

In this embodiment, resin sealing is performed by transfer molding using a first sealing mold 81 having a cavity corresponding to the resin-molded portion 40 and a second sealing mold 82 having no cavity (FIGS. 5C*a* and 5C*b*).

Positioning is performed such that the semiconductor chip 20 and the bent portions 103 of the lead main bodies 101 are placed in the cavity of the first sealing mold 81. The first and second sealing molds 81 and 82 are closed, and a thermosetting resin is injected into the sealing molds 81 and 82 heated at 170° C. to 190° C.

The width of the molded portion 40 is determined by the two-dimensional size of the semiconductor chip 20 and the interval between the bent portions 103. As has already been described, in this embodiment, the interval between the bent portions 103 is determined in correspondence with the distance between the bent portions 103. Therefore, the width of the molded portion 40 can be made close to the two-dimensional size of the semiconductor chip 20.

Figure 5D:
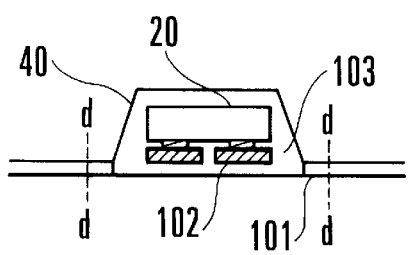
Figure 5D:
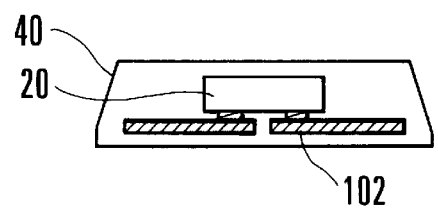

After the molded portion 40 is formed in the above-described manner, each lead main body 101 exposed to the outside is solder- or Au-plated. As shown in FIG. 5D*a*, each lead main body 101 is cut off along a line d—d near the resin-molded portion 40, thereby cutting off the semiconductor device from the lead frame 100 while leaving the external connection terminal portions.

A cutting die or laser can be used to cut off the lead main body 101.

Using the above-described method, a compact and low-profile semiconductor device can be manufactured. In addition, a humidity-resistant semiconductor device almost free from disconnections or omissions of the leads can be manufactured.

In the semiconductor device of the present invention, since the leads are bent in the X, Y, and Z directions, the stress to be transmitted to the bumps can be reduced. More specifically, since the lead has an L shape, the vibration, impact, or thermal stress in the X- and Y-axis directions can be absorbed. In addition, since the L-shaped lead has the bent portion, the vibration, impact, or thermal stress in the Y- and Z-axis directions can be absorbed. Therefore, the mechanical or thermal stress generated during the manufacturing process can be prevented from concentrating on the bump, so the connection strength of the bump can be kept stable.

Furthermore, since the lead main body and the chip mounting portion have an L shape, and the chip mounting portion is arranged in the molded body to be parallel to the centerline of the semiconductor device in the longitudinal direction, removal or peeling of leads from the semiconductor chip can be prevented. Consequently, the connection failure of the semiconductor device can be largely reduced.

Since the bent portion projects stepwise when viewed from the side surface, the leakage path from the outer environment can be made longer than that of the prior art, so the humidity resistance of the semiconductor device can be ensured.

The semiconductor chip is directly connected to the upper surfaces of the chip mounting portions which are formed to have a convex shape. For this reason, the semiconductor chip mounting position accuracy need only be taken into consideration with respect to the bumps smaller than the two-dimensional size of the semiconductor chip. Therefore, the two-dimensional size of the molding member of the semiconductor device can be made close to the size of the semiconductor chip, so the mounting area on the printed circuit board in mounting a component can be reduced.

Even when the distance between bumps becomes small due to the L-shaped leads, adjacent leads can be prevented from being short-circuited by a solder bridge.

When a notch is formed in the chip mounting portion along the lead main body, the interval between bumps can be further reduced. Therefore, the two-dimensional size of the semiconductor device and, more particularly, the width of the molded body can be made closer to the size of the semiconductor chip. As a result, the mounting area on the printed circuit board can be decreased.

When the bottom surface of the molded body and the lower surface of the lead main body exposed from the molding member are flush with each other, more stable mounting is allowed.

According to the lead frame of the present invention, the stress to be transmitted to the bump in the semiconductor device manufacturing process can be reduced, so the connection strength of the bump can be kept stable.

According to lead bonding of the present invention, the stress to be transmitted to the bump in the manufacturing process can be reduced, so the connection strength of the bump can be kept stable. In addition, a compact and low-profile semiconductor device having high humidity resistance and free from disconnections or omissions of the leads can be manufactured.

After resin sealing, a process of bending the leads is not performed. For this reason, the coplanarity of the lead main body is improved. In addition, since no stress due to bending process is applied, neither cracks nor gaps are generated in the resin, so degradation in humidity resistance can be prevented.

Even when a lead frame having a bent portion is used, the width of the supporting table to be used for thermal bonding in the direction of short side of the lead frame can be made larger than that of the chip mounting portion by forming the L-shaped lead. For this reason, when the chip mounting portion is to be mounted on the supporting table, a margin is obtained in the direction of short side of the lead frame, so the lead frame and the supporting table can be easily positioned in the bump connection process.

Furthermore, since the decrease in heating temperature when the lead frame contacts the supporting table in thermocompression bonding of the bumps can be minimized, a satisfactory bonding strength can be obtained.

What is claimed is:

1. A semiconductor device comprising:
   a plurality of leads, each of said leads having an elongated chip mounting portion electrically connected to a semiconductor chip, through a bump, and a lead main body;
   said lead main body supporting said chip mounting portion,
   wherein a lead path from a distal end of said lead main body to said bump is bent in X, Y, and Z directions forming a step shape projecting upward so that said distal end portion of said lead main body is at a lower level than said elongated chip mounting portion when viewed from a side surface of said device, and each lead main body and each elongated chip mounting portion substantially make a right angle to form a L-shaped lead as when viewed from an upper surface of said device;
   said semiconductor chip connected, through bumps, to upper surfaces of distal end portions of said elongated chip mounting portions of said leads which are arranged on a plane;
   a molded body sealing constituent elements except a portion of each said distal end of each said lead main body,
   wherein each of said plurality of leads is arranged such that said elongated chip mounting portions are arranged on both sides of a centerline of said semiconductor device in a longitudinal direction to be parallel to said centerline, and
   said L-shaped leads are arranged on one side such that said chip mounting portions oppose each other on a plane.

2. A device according to claim 1, wherein an interval between the lead main bodies of two of said plurality of leads arranged on a common side of said center line of said semiconductor device, is larger than an interval between said corresponding bumps contacting said two of said plurality of leads.

3. A device according to claim 1, wherein a bottom surface of said molded body and a lower surface of said lead main body exposed from said molded body are flush with each other.

4. A device according to claim 2, wherein a bottom surface of said molded body and a lower surface of said lead main body exposed from said molded body are flush with each other.

5. A semiconductor device according to claim 1, wherein said molded body is a resin.

6. A semiconductor device according to claim 1, wherein said unsealed portion of each distal end portion of each said lead main body is solder.

7. A semiconductor device according to claim 1, wherein said unsealed portion of each distal end portion of each said lead main body is Silver.

8. A semiconductor device according to claim 1, wherein said bumps are made of Gold.

9. A semiconductor device according to claim 1, wherein said bumps are made of an alloy.

10. A semiconductor device according to claim 1, wherein said bending of said lead path of each said lead in the X, Y, and Z directions is receptive to a support table supporting and contacting at least a bottom surface of each said chip mounting portion of each said lead.

11. A semiconductor device according to claim 1, wherein said bending of said lead path of each said lead in the X, Y, and Z directions is receptive to a support table supporting and contacting an entire bottom surface of each said lead.

12. A semiconductor device according to claim 1, wherein said bending, along said lead path, of said lead main body is bent at a notch on said chip mounting portion.

13. A device according to claim 1, wherein said bend in the X, Y, and Z directions forms an inclined portion so that said distal end portion of said lead main body is at a lower level than said elongated chip mounting portion.

14. A semiconductor device according to claim 2, wherein said molded body is a resin.

15. A semiconductor device according to claim 2, wherein said unsealed portion of each distal end portion of each said lead main body is solder.

16. A semiconductor device according to claim 2, wherein said unsealed portion of each distal end portion of each said lead main body is Silver.

17. A semiconductor device according to claim 2, wherein said bumps are made of Gold.

18. A semiconductor device according to claim 2, wherein said bumps are made of an alloy.

19. A semiconductor device according to claim 2, wherein said bending of said lead path of each said lead in the X, Y, and Z directions is receptive to a support table supporting and contacting at least a bottom surface of each said chip mounting portion of each said lead.

20. A semiconductor device according to claim 2, wherein said bending of said lead path of each said lead in the X, Y, and Z directions is receptive to a support table supporting and contacting an entire bottom surface of each said lead.

21. A device according to claim 2, wherein said bend in the X, Y, and Z directions forms an inclined portion so that said distal end portion of said lead main body is at a lower level than said elongated chip mounting portion.

22. A semiconductor device according to claim 18, wherein said alloy is Lead having about 5% Tin.

23. A semiconductor device according to claim 18, wherein said alloy is Palladium having about 1% Gold.

24. A semiconductor device according to claim 9, wherein said alloy is Lead having about 5% Tin.

25. A semiconductor device according to claim 9, wherein said alloy is Palladium having about 1% Gold.

26. A device according to claim 12, wherein a bottom surface of said molded body and a lower surface of said lead main body exposed from said molded body are flush with each other.

27. A semiconductor device according to claim 16, wherein said molded body is a resin.

28. A semiconductor device according to claim 12, wherein said unsealed portion of each distal end portion of each said lead main body is solder.

29. A semiconductor device according to claim 12, wherein said unsealed portion of each distal end portion of each said lead main body is Silver.

30. A semiconductor device according to claim 12, wherein said bumps are made of Gold.

31. A semiconductor device according to claim 12, wherein said bending of said lead path of each said lead in the X, Y, and Z directions is receptive to a support table supporting and contacting at least a bottom surface of each said chip mounting portion of each said lead.

32. A semiconductor device according to claim 12, wherein said bending of said lead path of each said lead in the X, Y, and Z directions is receptive to a support table supporting and contacting an entire bottom surface of each said lead.

33. A device according to claim 12, wherein an interval between said lead main bodies of said plurality of L-shaped leads arranged on one side of said semiconductor device is larger than a distance between said bumps of said semiconductor chip.

34. A semiconductor device according to claim 12, wherein said bumps are made of an alloy.

35. A device according to claim 12, wherein said bend in the X, Y, and Z directions forms an inclined portion so that said distal end portion of said lead main body is at a lower level than said elongated chip mounting portion.

36. A semiconductor device according to claim 34, wherein said alloy is Lead having about 5% Tin.

37. A semiconductor device according to claim 34, wherein said alloy is Palladium having about 1% Gold.

38. A lead frame comprising:
two outer frames parallel to each other; and
a plurality of leads each having an elongated chip mounting portion electrically connected to a semiconductor chip through a bump and a lead main body extending between said parallel outer frames on the same plane as that of said outer frames to support said elongated chip mounting portion, in which a lead path from a distal end of said lead main body to said bump is bent in X, Y, and Z directions forming a step shape projecting upward so that said distal end portion of said lead main body is at a lower level than said elongated chip mounting portion when viewed from a side surface.

39. A lead frame according to claim 38, wherein each of said plurality of leads is arranged such that
said lead main body and said chip mounting portion substantially make a right angle to form an L shape when viewed from an upper side,
said chip mounting portions are arranged on both sides of a centerline of said semiconductor device in a longitudinal direction to be parallel to the centerline, and
said L-shaped leads are arranged on one side such that said chip mounting portions oppose each other on a plane.

* * * * *